United States Patent [19]
Uemura

[11] Patent Number: 5,349,202
[45] Date of Patent: Sep. 20, 1994

[54] TUNNELING TRANSISTOR
[75] Inventor: Tetsuya Uemura, Tokyo, Japan
[73] Assignee: NEC Corporation, Japan
[21] Appl. No.: 981,248
[22] Filed: Nov. 25, 1992
[30] Foreign Application Priority Data
Dec. 2, 1991 [JP] Japan .................................. 3-318174
[51] Int. Cl.$^5$ .................. H01L 31/072; H01L 31/109
[52] U.S. Cl. ....................................... 257/25; 257/26; 257/22; 257/14
[58] Field of Search .................. 257/25, 29, 197, 198, 257/14, 22, 26

[56] References Cited
U.S. PATENT DOCUMENTS
5,079,601  1/1992  Esaki et al. .......................... 257/25
5,113,231  5/1992  Soderstrom et al. ................. 257/25

OTHER PUBLICATIONS
Longenbach et al.; "Resonant Interband Tunneling in InAs/GaSb/AlSb/InAs and GaSb/InAs/AlSb/GaSb Heterostructures"; Jul. 18, 1990; pp. 1554–1556.
"Quantum Functional Devices: Resonant-Tunneling Transistors, Circuits with Reduced Complexity, and Multiple-Valued Logic", IEEE Transactions on Electron Devices, vol. 16, No. 10, Oct. 1989, Federico Capasso et al.

Primary Examiner—Rolf Hille
Assistant Examiner—Wael Fahmy
Attorney, Agent, or Firm—Laff, Whitesel, Conte & Saret

[57] ABSTRACT

A tunneling transistor comprising an emitter layer, a barrier layer having a conduction band higher in energy than a conduction band of said emitter layer and a valence band lower in energy than a valence band of said emitter layer, and further having a thickness with which electrons can substantially tunnel the barrier layer, a collector layer having a conduction band lower in energy than the valence band of said emitter layer and a conductivity type opposite to said emitter layer, and further having a thickness with which quantum levels are substantially formed, a gate layer having a conduction band higher in energy than the conduction band of said layer and a valence band of said emitter layer, and further having a thickness with which the probability of electron tunneling is substantially greatly reduced, said layers been laminated in this order, and electrodes which form ohmic junctions on said emitter layer and said collector layer and an electrode which forms a Schottky junction on said gate layer.

3 Claims, 3 Drawing Sheets

TUNNELING TRANSISTOR

BACKGROUND OF THE INVENTION

1. Field of the Invention

The present invention relates to a tunneling transistor capable of controlling negative resistance characteristics.

2. Description of the Prior Art

Prior practice of negative resistance devices through tunneling includes a resonant hot electron transistor (RHET) and a resonant tunneling bipolar transistor (RBT), those transistors being constructed through combination of a resonant tunneling structure with a heterojunction bipolar transistor or a field effect transistor. These transistors are successful in the construction Ex-NOR gates, multiple-state holding gates, latch circuits and NOR circuits with a more reduced number of constituent transistors compared with prior art transistors, and hence attracts many interests with the expectation of application to functional devices. These devices are described, for example, in Electron Devices, Vol. 36, p 2065, 1989, F. Capasso, et al.

In the resonant tunneling effect, there is taken as a tunnel barrier the size of a discontinuity of conduction band energy in a semiconductor heterojunction, i.e., a difference between electron affinities between constituting semiconductors, so that the height of the tunnel barrier is not increased and the resonant tunneling effect is severely affected by a current (an excess current) based upon electrons going over the barrier by thermal excitation at room temperature.

The foregoing prior art tunneling transistors are therefore unlikely to be operational at room temperature.

SUMMARY OF THE INVENTION

To solve the difficulties with the prior art, it is an object of the present invention to provide a tunneling transistor capable of operation at room temperature by reducing the excess current in the tunneling transistor and increasing a tunnel current.

To achieve the above object, according to the present invention, there is provided a tunneling transistor comprising an emitter layer, a barrier layer having a conduction band higher in energy than a conduction band of the emitter layer and a valence band lower in energy than a valence band of the emitter layer, and further having a thickness through which electrons can substantially tunnel, a collector layer having a conduction band lower in energy than the valence band of the emitter layer and a conductivity type opposite to the emitter layer, and further having a thickness with which quantum levels are substantially formed, a gate layer having a conduction band higher in energy than the conduction band of the emitter layer and a valence band of the emitter layer, and further having a thickness with which the probability of electron tunneling is substantially greatly reduced, the layers being laminated in this order, and electrodes which form ohmic junctions on the emitter layer and the collector layer and an electrode which forms a Schottky junction on the gate layer.

In accordance with the present invention, for ensuring the decrease of the excess current and the increase of the tunnel current, there is used interband tunneling between the valence band and the conduction band of the constituent semiconductors instead of tunneling between conduction bands of a constituent semiconductor. In the tunneling transistor of the present invention, differential negative resistance is produced in the current-voltage characteristic which resistance is controllable by the gate electrode.

The present invention manifests the following advantages: Use of the resonant tunneling between the energy bands instead of the prior art resonant tunneling between the conduction bands ensures an increase of tunnel current density and suppression of the excess current, and permits room temperature operation. Compared with the prior art AlGaAs devices the transistor according to the present invention can suppress to 1/6-⅛ the excess current at predetermined current density and 77K operation temperature.

The above and in any other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

In the following there will be described the present invention with reference to the attached drawings each illustrating some preferred and concrete examples of the present invention.

Figure 1:
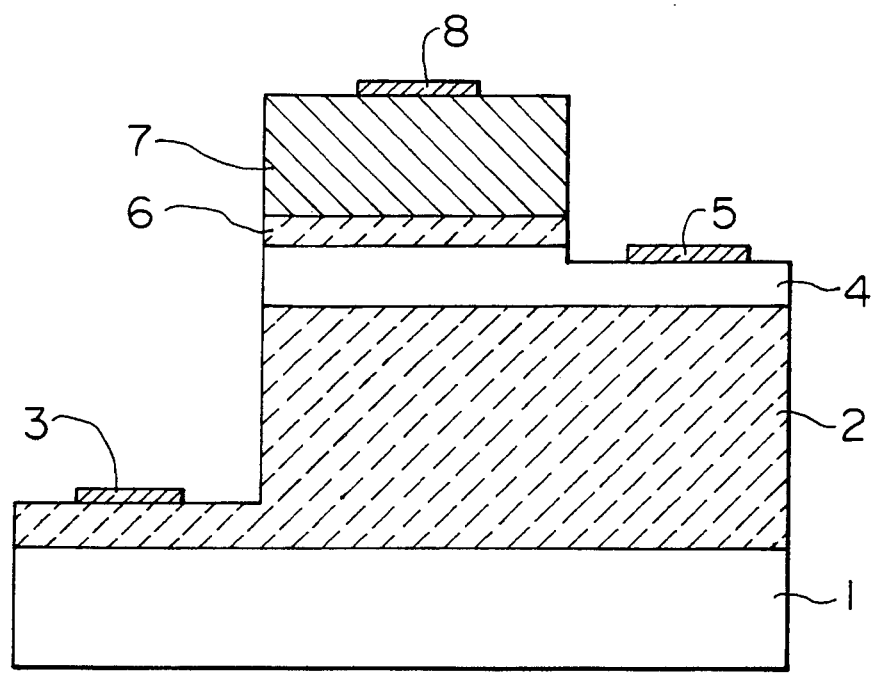
FIG. 1 is a sectional view illustrating a first embodiment of the present invention.
Figure 2:
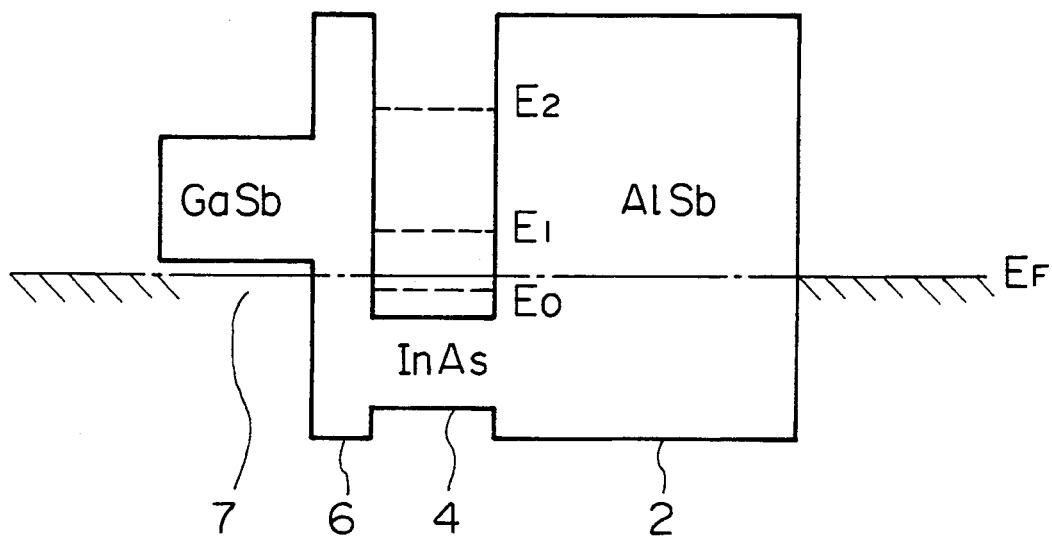
FIG. 2 is a view illustrating a band structure of the first embodiment.

Referring to FIGS. 1 and 2, there are illustrated respectively an arrangement of a first concrete example of the present invention in the form of a cross section, and an energy band structure in the arrangement of FIG. 1.

As illustrated in FIG. 1, an AlSb barrier layer 2 which is a second semiconductor is provided on an InAs substrate 1 of a transistor, and a gate electrode 3 is formed on the top surface of the barrier layer 2 on one side of the same and, on the other hand, an InAs collector layer 4 is formed on the top surface of the barrier layer 2 on the other side of the same. On the top surface of the collector layer 4 on one side of the same an AlSb barrier layer 6 is disposed, while on the top surface of the same on the other side of the same a collector electrode 5 is disposed to form an ohmic junction with the collector layer 4. On the top surface of the AlSb barrier layer 6 there is provided a GaSb emitter layer 7. On the top surface of the emitter layer 7 an emitter electrode 8 is disposed to form an ohmic junction with the emitter layer 7.

As illustrated in FIG. 2, a valence band of the GaSb emitter layer 7 is located above a conduction band of the InAs collector layer 4 by about 150 meV, and interband tunneling is provided through the AlSb barrier layer 6. Quantum levels are formed in the InAs collector layer 4 disposed between the AlSb barrier layer 2 and the AlSb barrier layer 6, so that only electrons in the GaSb valence band having energy resonating those energy levels tunnel toward the InAs collector layer 4 to produce a collector current. With the thickness of an InAs quantum well assumed to be 100 Å, a first quantum level $E_0$ is formed substantially above an InAs conduction band edge by about 80 meV and below a GaSb valence band edge by about 70 meV. The quantum levels in the InAs collector layer 4 can be varied by gate voltage applied to the gate electrode 3 located oppositely to the GaAs emitter layer 7, with respect to the collector layer 4 whereby negative resistance characteristics of the embodiment can be controlled. With the gate electrode 3 supplied with negative voltage, negative voltage is applied to the InAs quantum well and a current is produced in a resonant manner when the quantum level is coincident with the Fermi level of the GaSb emitter. With the applied negative voltage increased further, the quantum level is shifted to be located in a GaSb gap. Hereby, the current is decreased to produce the negative resistance characteristics.

Figure 3:
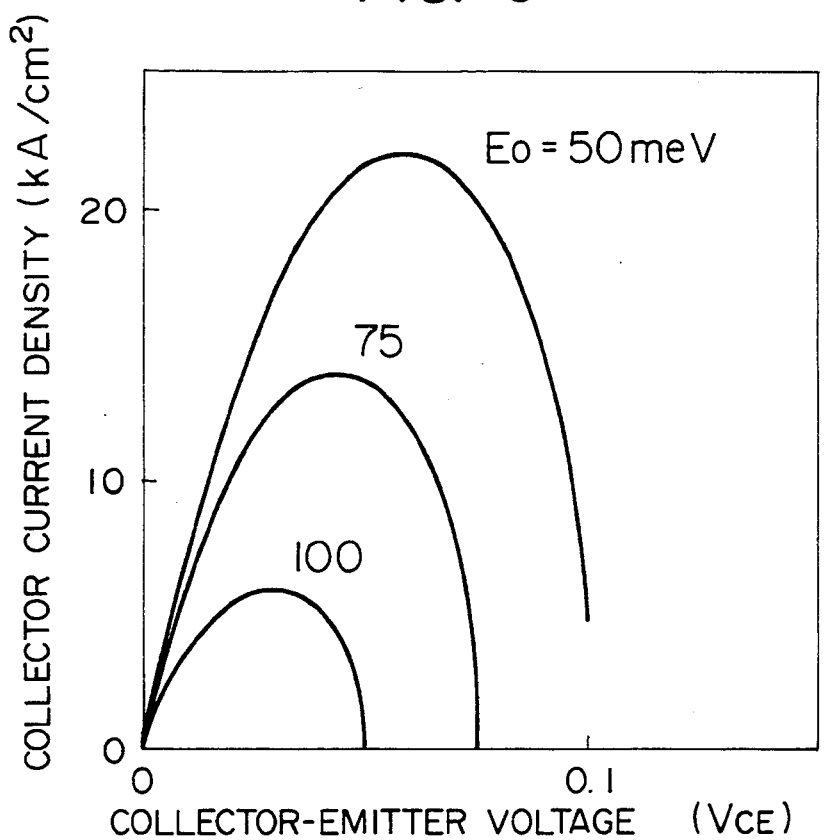
FIG. 3 is a view illustrating a current-voltage characteristic of the first embodiment.

Referring to FIG. 3, there is illustrated a collector current-voltage characteristic for varieties of the quantum levels. For constants used, the thickness of the AlSb barrier layer 6 is assumed to be 20 Å and the Fermi level in thermal equilibrium is assumed to be located above the InAs conduction band by 75 meV.

Figure 4:
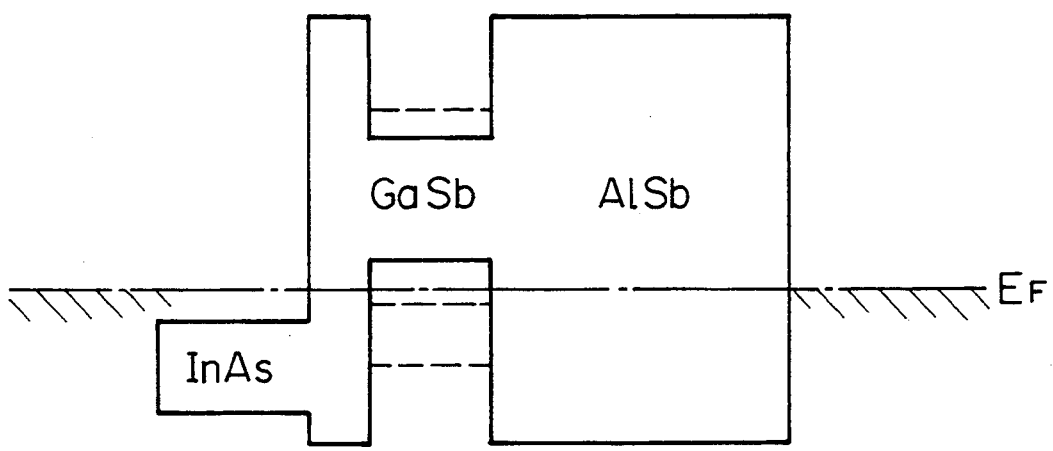
FIG. 4 is a view illustrating a band structure of a second embodiment of the present invention.

Referring to FIG. 4, there is illustrated an energy band structure of a second preferred embodiment. The identical operation to that of the transistor of the first embodiment is exhibited by reversing the polarity of the applied voltage. The present embodiment offers a complementary device to the first embodiment of FIG. 1.

Figure 5:
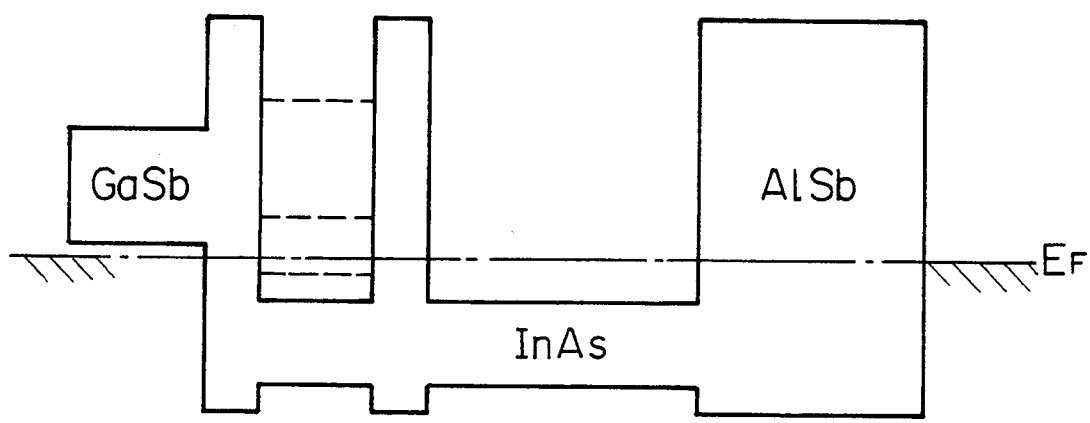
FIG. 5 is a view illustrating a band structure of a third embodiment of the present invention.

Referring to FIG. 5, there is illustrated an energy band structure of a third preferred embodiment. Although in FIG. 1 the collector electrode forms its contact on the quantum well layer, in the present embodiment a double barrier quantum well layer is inserted between an emitter and a collector to permit a collector layer to be made thicker. Formation of the collector electrode can thus be more facilitated compared with the first arrangement.

Figure 6:
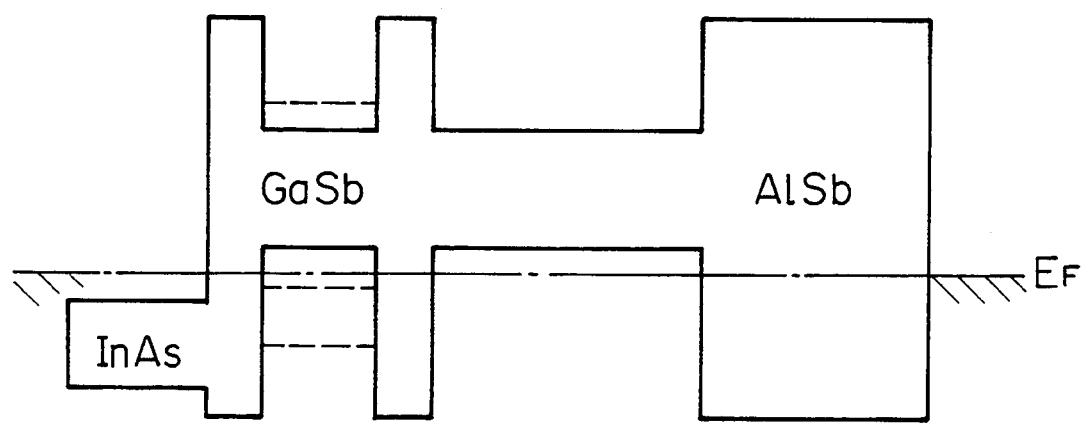
FIG. 6 is a view illustrating a band structure of a fourth embodiment of the present invention.

Referring further to FIG. 6, there is illustrated a fourth preferred embodiment of the present invention. Identical operation to the transistor of FIG. 5 is demonstrated by reversing the polarity of the applied voltage.

The present embodiment offers a complementary device to the device of FIG. 5.

According to the present invention, as described above, use is made of the interband tunneling instead of the prior art resonant tunneling between the conduction bands, whereby the tunnel current density is increased with the excess current being suppressed to permit the transistor of the present invention to be operational at room temperature. Compared with the prior art AlGaAs device, the transistor of the present invention suppresses the excess current to $1/6-\frac{1}{8}$ with the assumption of the current density to be constant and operation temperature to be 77K.

What is claimed is:

1. A tunneling transistor comprising:
   an emitter layer forming a first semiconductor:
   a barrier layer forming a second semiconductor, and having a conduction band higher in energy than a conduction band of said emitter layer and a valence band lower in energy than a valence band of said emitter layer, and further having a thickness with which electrons can tunnel the barrier layer;
   a collector layer forming of a third semiconductor, and having a conduction band lower in energy than the valence band of said emitter layer and a conductivity type opposite to said emitter layer, and further having a thickness with which quantum levels are formed;
   a gate layer having a conduction band higher in energy than the conduction band of said emitter layer and a valence band lower in energy than the valence band of emitter layer, and further having a thickness with which the probability of electron tunneling is greatly reduced, layers being laminated in this order;
   electrodes which form ohmic junctions on emitter layer and said collector layer, respectively;
   and an electrode which forms a Schottky junction on gate layer.

2. A tunneling transistor according to claim 1 wherein said second semiconductor disposed between said first and third semiconductors comprises a double barrier arrangement where said third semiconductor is disposed between two layers of said second semiconductor.

3. A tunneling transistor according to claim 1 or 2 wherein said first semiconductor is replaced with said third semiconductor.

* * * * *